United States Patent
Tsai et al.

(10) Patent No.: US 9,013,089 B2
(45) Date of Patent: Apr. 21, 2015

(54) MICROELECTROMECHANICAL SYSTEM-BASED RESONATOR DEVICE

(71) Applicant: Industrial Technology Research Institute, Hsinchu (TW)

(72) Inventors: Chun-Yin Tsai, Kaohsiung (TW); Feng-Chia Hsu, Kaohsiung (TW); Tsun-Che Huang, Tainan (TW); Chin-Hung Wang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 197 days.

(21) Appl. No.: 13/911,041

(22) Filed: Jun. 5, 2013

(65) Prior Publication Data
US 2014/0184029 A1 Jul. 3, 2014

(30) Foreign Application Priority Data
Jan. 2, 2013 (TW) .............................. 102100004 A

(51) Int. Cl.
*H03H 9/17* (2006.01)
*H03H 9/205* (2006.01)
*H03H 9/05* (2006.01)

(52) U.S. Cl.
CPC ................ *H03H 9/178* (2013.01); *H03H 9/17* (2013.01); *H03H 9/205* (2013.01); *H03H 9/0595* (2013.01)

(58) Field of Classification Search
CPC ......... H03H 9/17; H03H 9/178; H03H 9/205; H03H 9/0595
USPC ................................................ 310/320, 321
See application file for complete search history.

(56) References Cited

U.S. PATENT DOCUMENTS

| | | | | |
|---|---|---|---|---|
| 3,209,176 A | * | 9/1965 | Paley | 310/331 |
| 3,293,575 A | * | 12/1966 | Albsmeier | 333/186 |
| 3,376,521 A | * | 4/1968 | Traub | 333/186 |
| 3,378,794 A | * | 4/1968 | Traub et al. | 333/200 |
| 3,396,287 A | * | 8/1968 | Horton | 310/312 |
| 3,408,514 A | * | 10/1968 | Adamietz et al. | 310/321 |
| 3,576,453 A | * | 4/1971 | Mason | 310/320 |
| 4,471,296 A | * | 9/1984 | Dalgaard | 324/71.1 |

(Continued)

FOREIGN PATENT DOCUMENTS

| | | |
|---|---|---|
| CN | 1620755 A | 5/2005 |
| TW | 200301577 | 7/2003 |

(Continued)

OTHER PUBLICATIONS

Zuo et al., "Channel-Select RF MEMS Filters Based on Self-Coupled AlN Contour-Mode Piezoelectric Resonators", IEEE Ultrasonics Symposium, Nov. 2007, pp. 1156-1159, IEEE, US.

(Continued)

*Primary Examiner* — Thomas Dougherty

(57) ABSTRACT

The disclosure provides a structure for a microelectromechanical system (MEMS)-based resonator device. The structure for the MEMS-based resonator device includes at least one resonator unit. The at least one resonator unit comprises a substrate having a trench therein. A pair of first electrodes is disposed on a pair of sidewalls of the trench. A piezoelectric material fills the trench, covering the pair of first electrodes. A second electrode is embedded in the piezoelectric material, separated from the pair of first electrodes by the piezoelectric material. The second electrode disposed in the trench is parallel to the pair of first electrodes.

16 Claims, 11 Drawing Sheets

(56) References Cited

U.S. PATENT DOCUMENTS

| | | | |
|---|---|---|---|
| 5,382,930 | A | 1/1995 | Stokes et al. |
| 6,822,536 | B1 | 11/2004 | Nishimura et al. |
| 6,897,744 | B2 | 5/2005 | Mitani et al. |
| 7,019,605 | B2 | 3/2006 | Larson, III |
| 7,067,964 | B1 | 6/2006 | Kosinski |
| 7,199,505 | B2 | 4/2007 | Inoue |
| 7,424,772 | B2 | 9/2008 | Larson, III |
| 7,492,241 | B2 | 2/2009 | Piazza et al. |
| 7,847,656 | B2 | 12/2010 | Ayazi et al. |
| 7,915,974 | B2 | 3/2011 | Piazza et al. |
| 2003/0112097 | A1* | 6/2003 | Ma et al. ............ 333/187 |
| 2007/0115078 | A1 | 5/2007 | Sano et al. |
| 2012/0012356 | A1* | 1/2012 | Satoh et al. ......... 174/50.52 |

FOREIGN PATENT DOCUMENTS

| | | |
|---|---|---|
| TW | 573375 | 1/2004 |
| TW | 201233060 A1 | 8/2012 |

OTHER PUBLICATIONS

Li et al., "Disk-Array Design for Suppression of Unwanted Modes in Micromechanical Composite-Array Filters", MEMS 2006 Istanbul, Turkey, Jan. 2006, pp. 866-869, IEEE, Turkey.

Stephanou et al., "Piezoelectric Thin Film ALN Annular Dual Contour Mode Bandpass Filter", 2005 ASME International Mechanical Engineering Congree & Exposition, Nov. 5-11, 2005, pp. 1-7, ASME, US.

Ruby et al., "Ultra-Miniature High-Q Filters and Duplexers Using FBAR Technology", 2001 IEEE International Solid-State Circuits Conference, Feb. 2001, 3 pages, IEEE, US.

Ruppel et al., "SAW Devices for Consumer Communication Applications", IEEE Transactions on Ultrasonics, Ferroelectrics, and Frequency Control, Sep. 1993, pp. 438-452, vol. 40, No. 5, IEEE, US.

Nam et al., "Monolithic 1-Chip FBAR Duplexer for W-CDMA Handsets", Sensors and Actuators A: Physical, May 2008, pp. 162-168, vol. 143, Elsevier B.V., US.

"RF Filters, Pas, Antenna Switches & Tunability for Cellular Handsets", Mar. 2012, 16 pages, downloaded from http://zh.scribd.com/doc/94537034/Yole-RF-Filters-PAs-Antenna-Switches-Report-Sample, Yole Developpement.

Tabrizian et al., "Laterally-Excited Silicon Bulk Acoustic Resonators with Sidewall ALN", Transducers' 11, Jun. 2011, pp. 1520-1523, IEEE, China.

White et al., "Direct Piezoelectric Coupling to Surface Elastic Waves", AIP Applied Physics Letters, Dec. 1965, pp. 314-316, vol. 7, No. 12, American Institute of Physics, US.

* cited by examiner

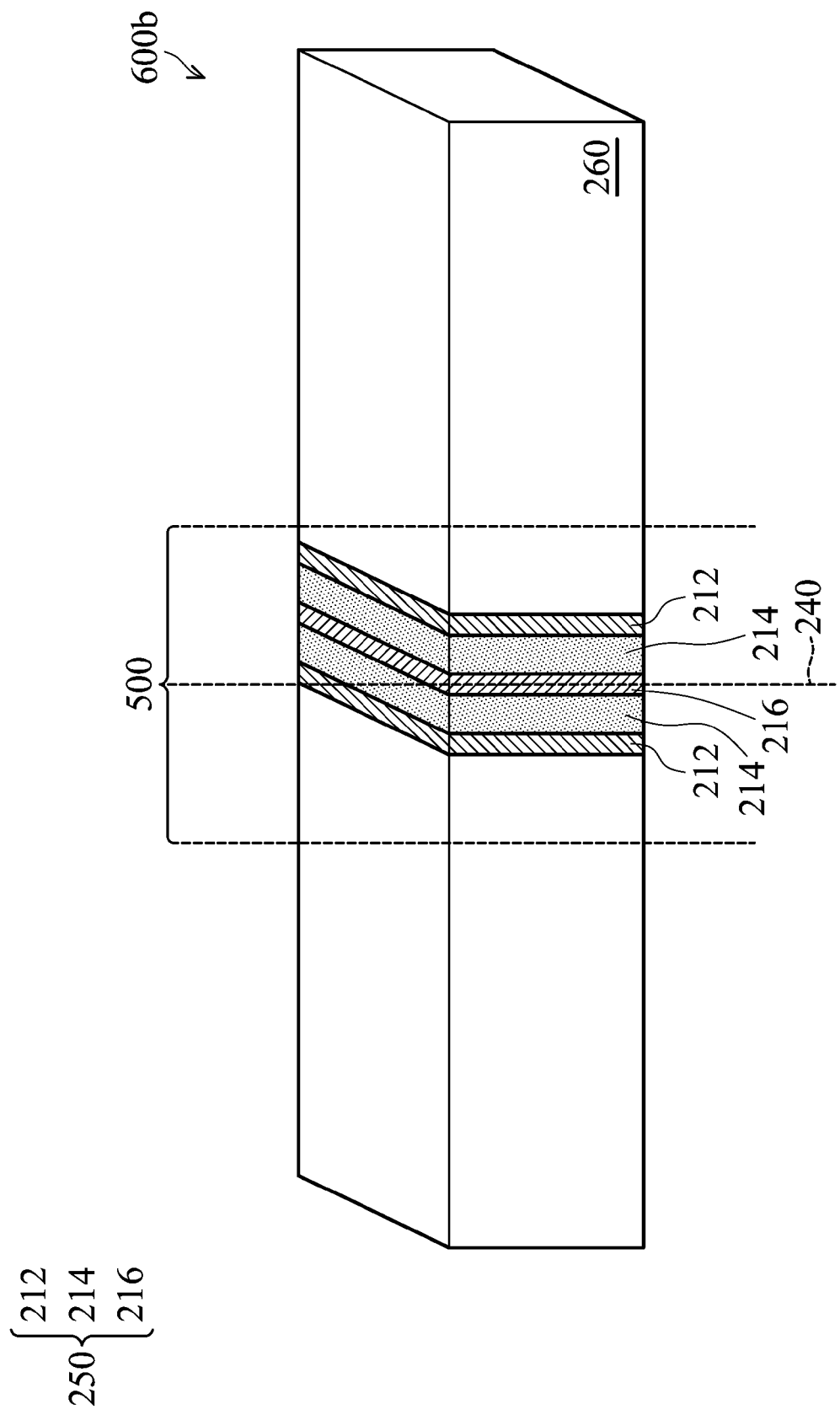

MICROELECTROMECHANICAL SYSTEM-BASED RESONATOR DEVICE

CROSS REFERENCE TO RELATED APPLICATIONS

The present application is based on, and claims priority from, Taiwan Application Serial Number 102100004, filed Jan. 2, 2013, the disclosure of which is hereby incorporated by reference herein in its entirety.

TECHNICAL FIELD

The present invention relates to a microelectromechanical system (MEMS)-based resonator device, and in particular, a MEMS-based resonator device having a high electro-mechanical coupling coefficient) and low impedance.

BACKGROUND

One of the challenges of the multi-mode and multi-standard wireless communication systems of today is the integration of large numbers of filters and transistor circuits. Therefore, a multi-band filter bank module fabricated in a single chip is the only solution to the aforementioned problem.

The conventional microelectromechanical system (MEMS)-based filter usually comprises two types of structures. One is a film bulk acoustic-wave resonator (FBAR) structure and another is a thickness field excitation (TFE) resonator structure. For the conventional FBAR MEMS-based filter, the direction of the electrode field ($E_{field}$) that is generated is parallel to a strain direction of the piezoelectric material, so that the conventional FBAR MEMS-based filter utilizes the piezoelectric coefficient D33. The operation frequency of the conventional FBAR MEMS-based filter, however, is defined by the film thickness of the piezoelectric material. The piezoelectric materials of the conventional FBAR MEMS-based filters cannot be deposited as films with various thicknesses on a surface of a single substrate due to limitations of the conventional thin-film process. Therefore, the conventional FBAR MEMS-based filter cannot achieve the goal of having a multi-band filter bank module in a single chip Additionally, the direction of the electrode field ($E_{field}$) generated by the conventional TFE MEMS-based filter is parallel to the strain direction of the piezoelectric material of the conventional TFE MEMS-based filter, so that the conventional TFE MEMS-based filter utilizes the piezoelectric coefficient D31. The electro-mechanical conversion efficiency of the conventional TFE MEMS-based filter is reduced. Therefore, the conventional TFE MEMS-based filter cannot satisfy the communication system specification of today due to its disadvantages, for example, high input impedance and narrow bandwidth.

Thus, a novel MEMS-based resonator device having a high electro-mechanical coupling coefficient ($K_{eff}^2$) and low impedance is desirable to achieve a goal of a multi-band filter module in a single chip.

SUMMARY

A structure for a microelectromechanical system (MEMS)-based resonator device is provided. An exemplary embodiment of the structure for the MEMS-based resonator device includes at least one resonator unit. The at least one resonator unit comprises a substrate having a trench therein. A pair of first electrodes is disposed on a pair of sidewalls of the trench. A piezoelectric material fills the trench, covering the pair of first electrodes. A second electrode is embedded in the piezoelectric material, separated from the pair of first electrodes by the piezoelectric material, wherein the second electrode disposed in the trench is parallel to the pair of first electrodes.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIGS. 8A and 8B show three-dimensional views of a MEMS-based resonator device according to exemplary embodiments.

DETAILED DESCRIPTION

Figure 1A:
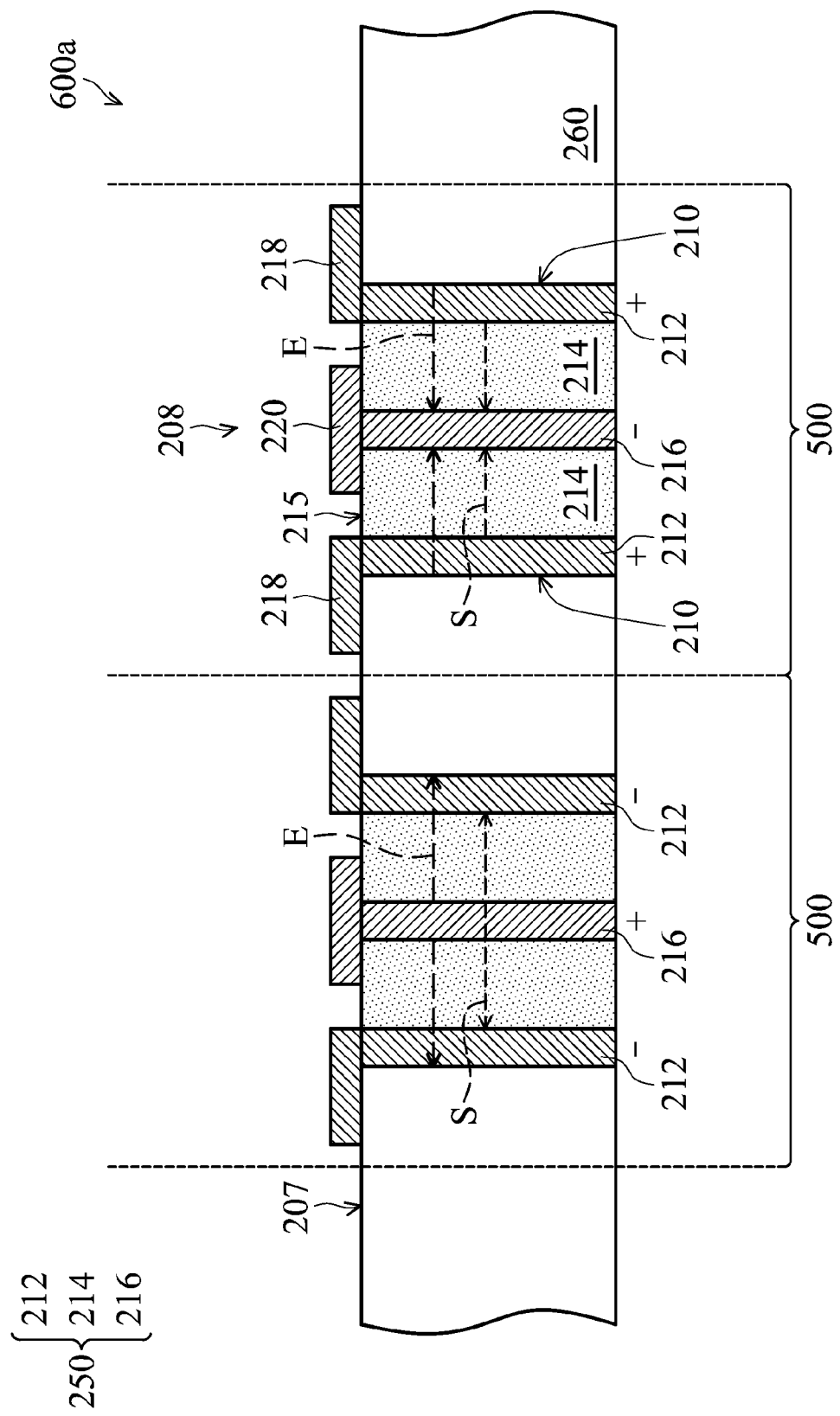
FIG. 1A shows a cross section of a microelectromechanical system (MEMS)-based resonator device according to an exemplary embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 6:
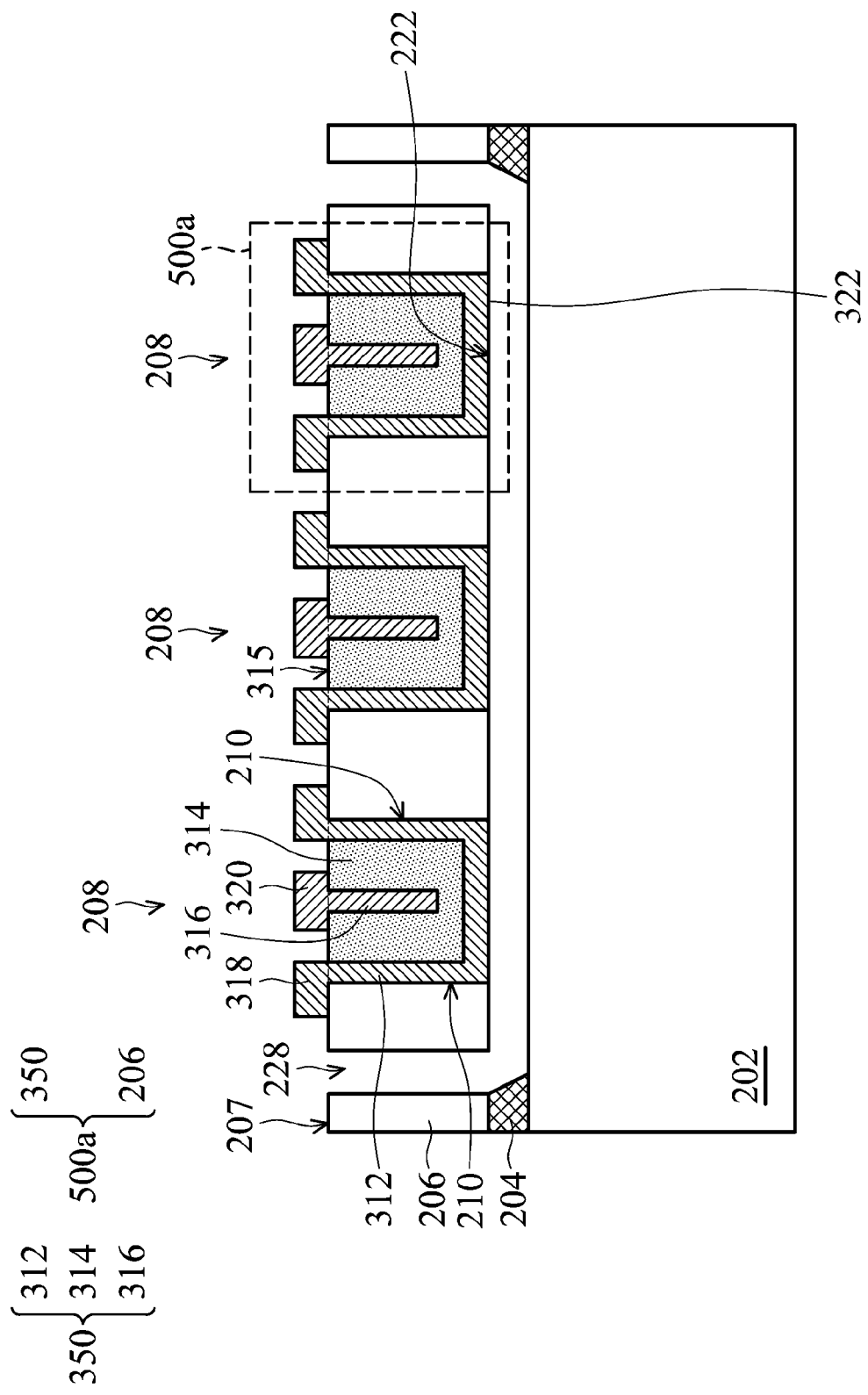
Figure 7:
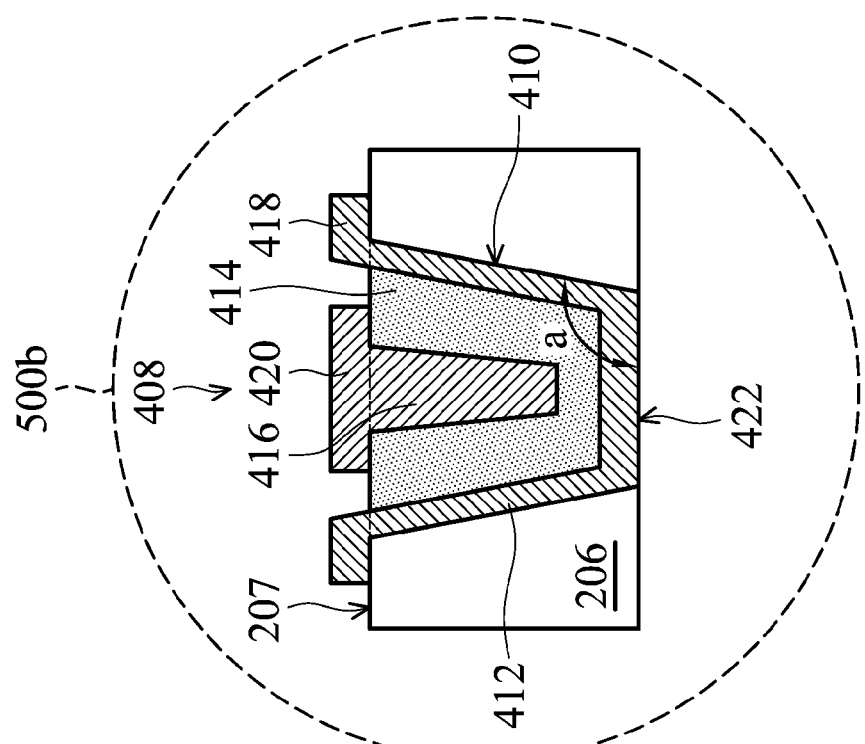
FIG. 7 shows a cross section of a MEMS-based resonator device according to another exemplary embodiment.

FIG. 1A shows a cross section of a microelectromechanical system (MEMS)-based resonator device 600a according to an exemplary embodiment. The MEMS-based resonator device 600a may comprise a side-field excitation (SFE) piezoelectric bulk acoustic wave resonator having a side-field excitation (SFE) bulk acoustic resonance mode. That is to say, the strain direction of the piezoelectric material of the resonator is parallel to the electrode field generated by the resonator. Therefore, the side-field excitation (SFE) piezoelectric bulk acoustic wave resonator has a high electro-mechanical coupling coefficient ($K_{eff}^2$). As shown in FIG. 1A, the MEMS-based resonator device 600a may comprise a plurality of continuously arranged resonator units 500. There are two resonator units shown in this embodiment in FIG. 1A, for example. Each of a plurality of resonator units 500 comprises a substrate 260 having a trench 208 therein. In one embodiment, the substrate 260 may comprise a device layer, a silicon-on-insulator (SOI) wafer, for example. In one embodiment, sidewalls 210 of the trench 208 are substantially perpendicular to the top surface 207 of the substrate 260. A pair of first electrodes 212 is disposed on the pair of sidewalls 210 of the trench 208. In one embodiment, the pair of first electrodes 212 may extend to the bottom surface of the trench 208. Also, the pair of first electrodes 212 may be connected to each other (for example, the first electrode 312 as shown in FIG. 6 or the first electrode 412 as shown in FIG. 7). In another embodiment, the pair of first electrodes 212 may be connected to each other in a position which is out of the trench 208. A piezoelectric material 214 fills the trench 208, covering the sidewall of the pair of first electrodes 212. In one embodiment, the piezoelectric material 214 may comprise AlN, ZnO, ZnS, CdTe, CdS or quartz. A second electrode 216 is embedded in the piezoelectric material 214, separated from the pair of first electrodes 212 by the piezoelectric material 214. In one embodiment, the second electrode 216 is embedded in a central position of the piezoelectric material 214. Also, the second electrode 216 extends from the top surface 215 of the piezoelectric material 214 to the bottom surface of the trench 208. Further, the second electrode 216 is parallel to the pair of first electrodes 212 disposed in the trench 208. Therefore, the direction E of the electrode field generated between the pair of first electrodes 212 and the second electrode 216 is parallel to the direction S of polarization of the piezoelectric material 214. In one embodiment, the pair of first electrodes 212 and the second electrode 216 may comprise conductive materials such as metal. As shown in FIG. 1, in one embodiment, the pair of first electrodes 212 is parallel to the second electrode 216. As shown in FIG. 1, in one embodiment, the pair of first electrodes 212, the second electrode 216 and the piezoelectric material 214 disposed in the trench 208 may be collectively constructed as an actuator 250. In one embodiment, the resonator unit 500 may further comprise a pair of output electrodes 218 disposed on the top surface 207 of the substrate 260, respectively connected to the top surfaces of the pair of first electrodes 212. Also, the resonator unit 500 may further comprise an input electrode 220 disposed on the top surface 215 of the piezoelectric material 214, connected to the top surface of the second electrode 216. Therefore, the input electrode 220 is disposed between the pair of output electrodes 218. Additionally, the pair of output electrodes 218 is disposed on the top surface 207 of the substrate 260. Also, the input electrode 220 is disposed on the top surface 215 of the piezoelectric material 214. Moreover, the pair of output electrodes 218 is substantially perpendicular to the second electrode 216. In one embodiment, the pair of output electrodes 218 and the input electrode 220 may comprise conductive materials such as metal. For example, the pair of output electrodes 218 and the input electrode 220 may comprise Al.

Figure 1B:
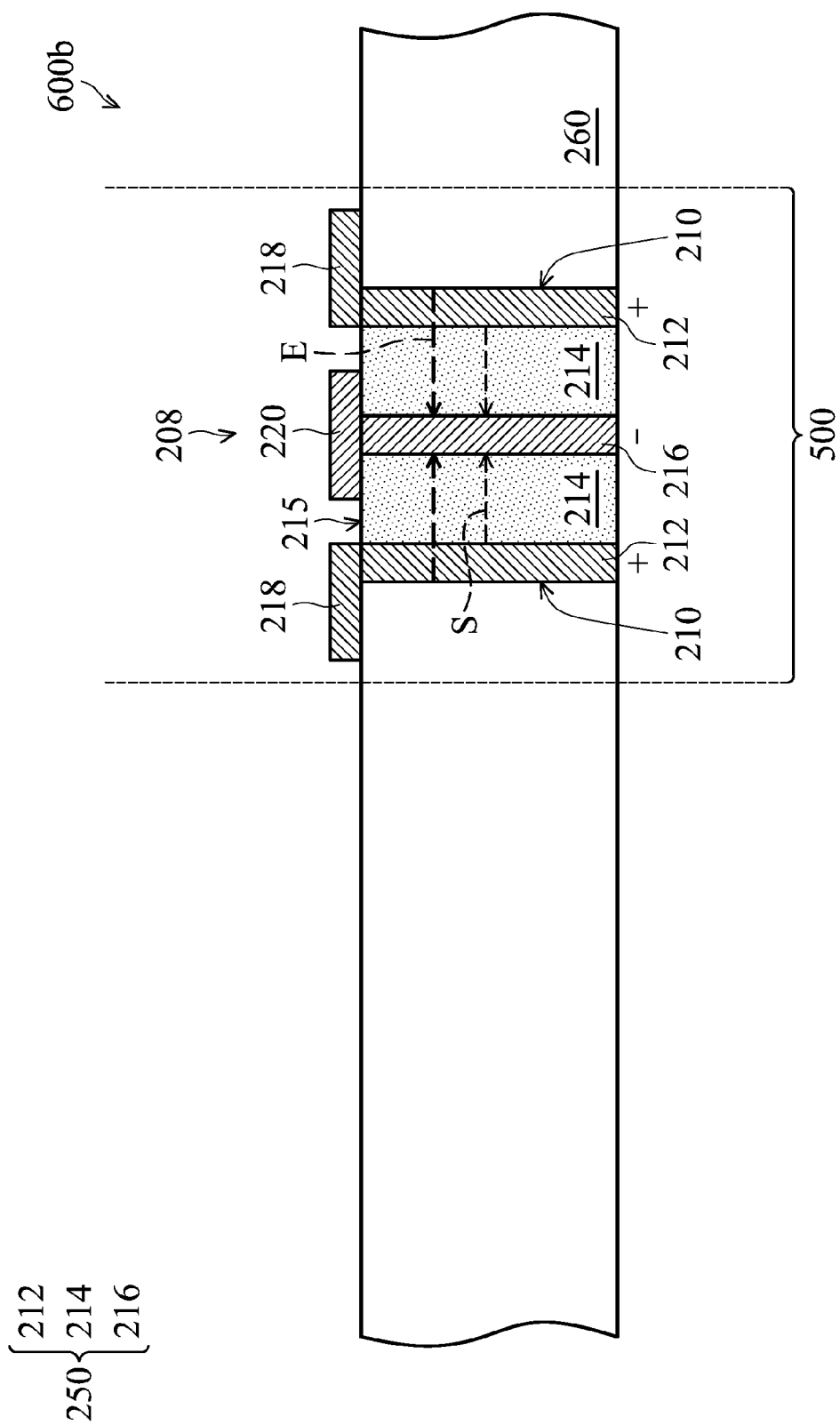
FIG. 1B shows a cross section of a microelectromechanical system (MEMS)-based resonator device according to another exemplary embodiment.

Alternatively, the MEMS-based resonator device may also comprise a single resonator unit. FIG. 1B shows a cross section of a microelectromechanical system (MEMS)-based resonator device 600b according to another exemplary embodiment. In this embodiment as shown in FIG. 1B, the MEMS-based resonator device 600b may comprise a single resonator unit 500. Elements of the embodiment hereinafter, that are the same or similar as those previously described with reference to FIG. 1A, is not repeated for brevity.

Figure 2:
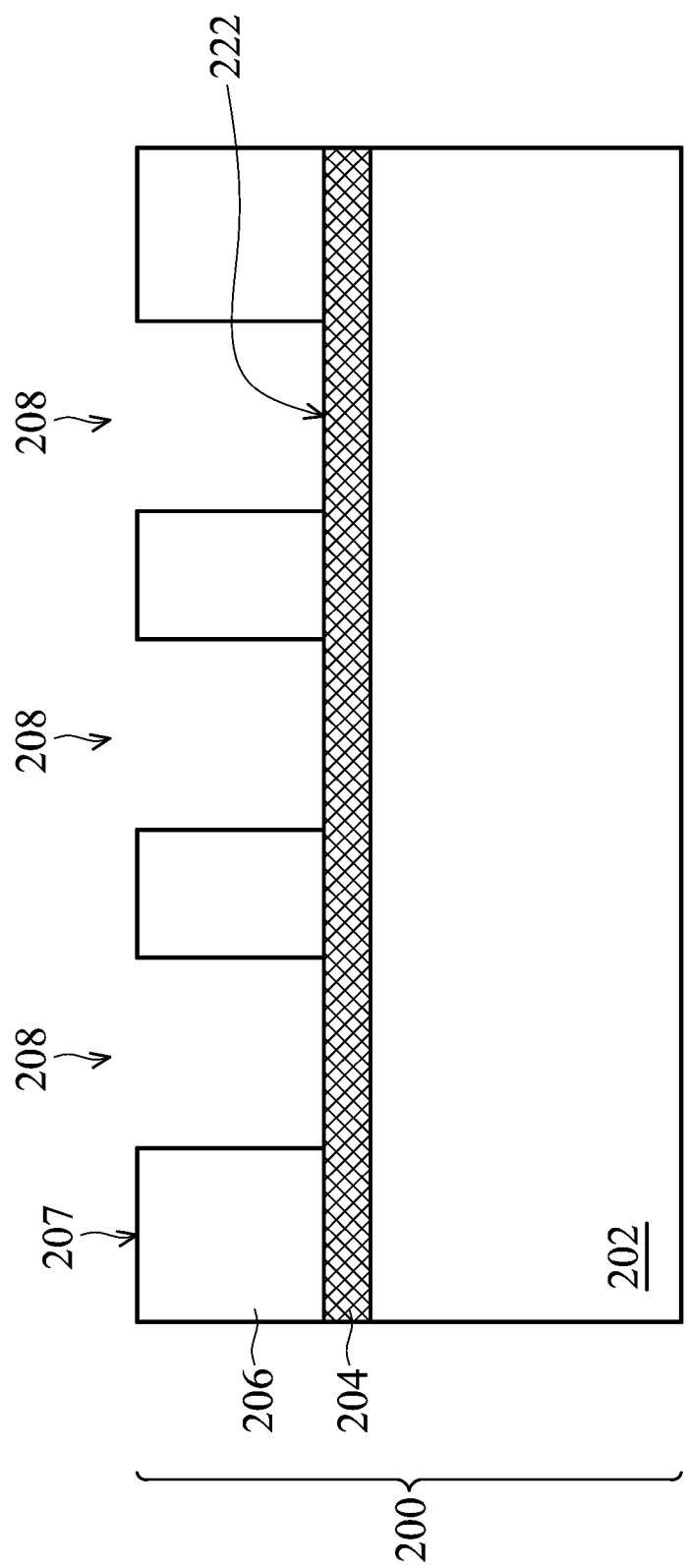
FIGS. 2 to 6 are cross sections showing a method for fabricating a base for the MEMS-based resonator device according to an exemplary embodiment.

FIGS. 2 to 6 are cross sections showing a method for fabricating a MEMS-based resonator device 600a according to an exemplary embodiment. As shown in FIG. 2, firstly, a substrate 200 is provided. In one embodiment, the substrate 200 may comprise a semiconductor chip such as a silicon-on-insulator (SOI) wafer. In one embodiment in which the substrate 200 is a silicon-on-insulator (SOI) wafer, the substrate 200 may comprise a handle layer 202, a sensor-device layer 206 disposed over the handle layer 202, and an insulating layer 204 disposed between the sensor-device layer 206 and the handle layer 202.

Next, as shown in FIG. 2, trenches 208 may be formed in the sensor-device layer 206 of the substrate 200, so that the boundary position of the actuator of each of a plurality of resonator units 500. Also, a formation method of the boundary position may comprise forming a mask pattern (not shown) on the sensor-device layer 206 to define a position of the subsequently formed trench 208. Next, an anisotropic etching process is performed to remove the sensor-device layer 206 not covered by the mask pattern, thereby forming the trench 208 in the sensor-device layer 206. In one embodiment as shown in this figure (FIG. 2), the trench 208 is formed through the sensor-device layer 206. This time, the insulating layer 204 may also serve as an etching stop layer in the aforementioned anisotropic etching process. Finally, the mask pattern is removed.

Figure 3:
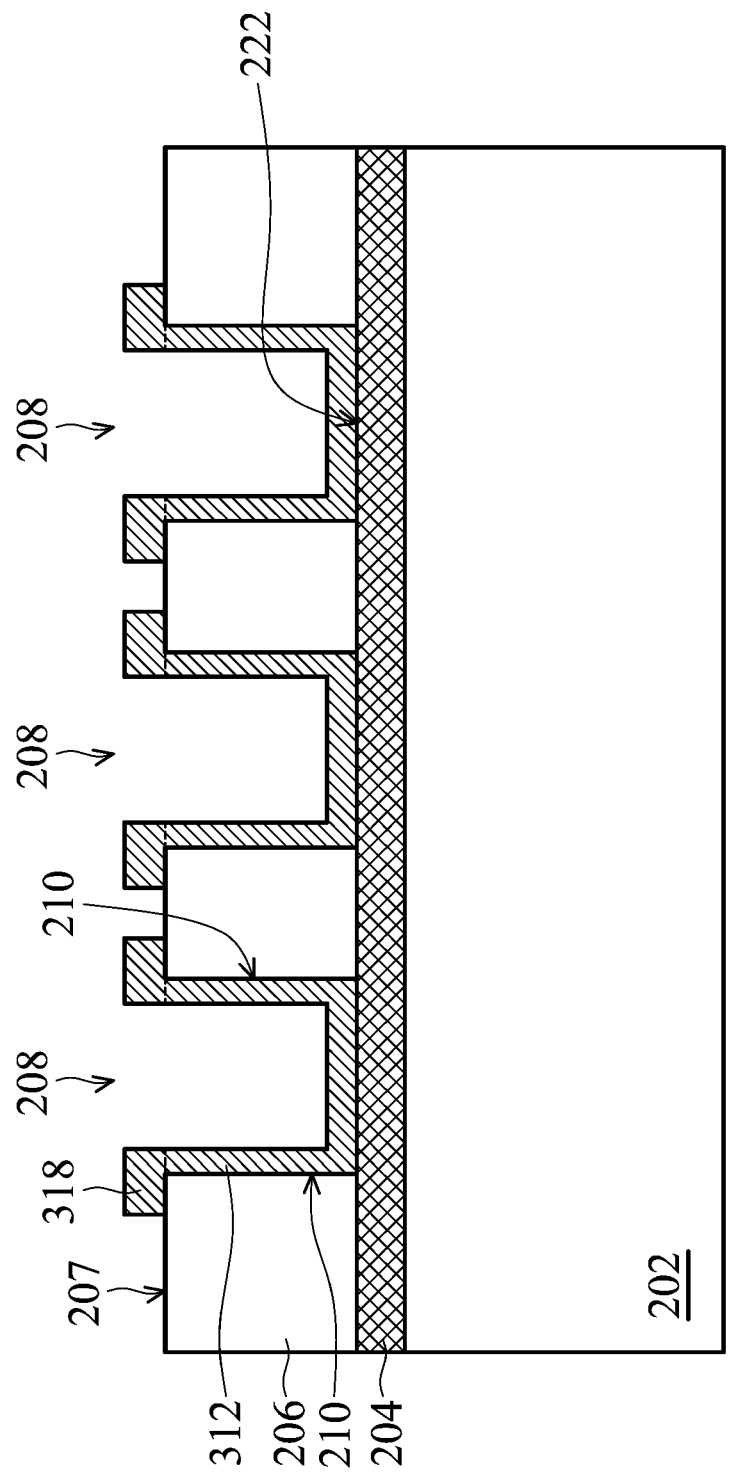

Next, as shown in FIG. 3, a deposition process may be performed on the sidewalls 210 and the bottom surface 222 of the trench 208 to comfortably form a first electrode 312. Simultaneously, an input electrode 318 is formed on the first electrode 312, extending onto the top surface 207 of the substrate 200 (the sensor-device layer 206 of the substrate 200). Next, a patterning process is performed on the input electrode 318 formed on the top surface 207, so that the input electrode 318 is divided onto a plurality of input electrodes 318 in different trenches 208, and the plurality of input electrodes 318 are separated from each other. Additionally, the first electrode 312 may be divided into a pair of first electrodes (such as the pair of first electrodes 212 as shown in FIG. 1) separated from each other by the patterning process.

Figure 4:
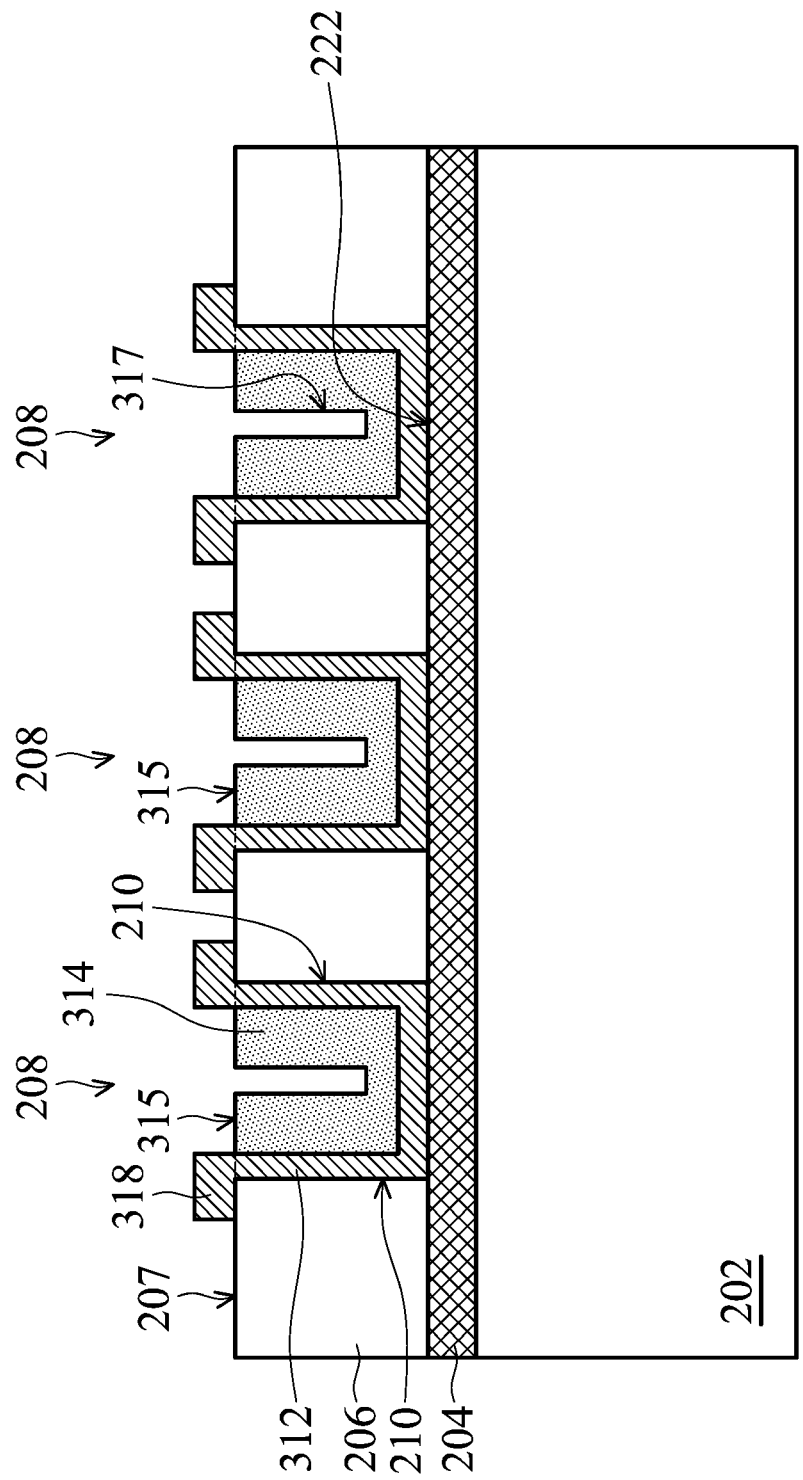

Next, as shown in FIG. 4, a deposition process and a patterning process may be performed to fill a piezoelectric material 314 into the trench 208, covering the first electrode 312. As shown in FIG. 4, the piezoelectric material 314 may have a trench 317 extending from the top surface 315 of the piezoelectric material 314 to a portion of the piezoelectric material 314. Alternatively, the trench 317 may extend from the top surface 315 of the piezoelectric material 314 to the insulating layer 204. In one embodiment, the patterning process may comprise a lithography process and an etching process, so that the formation position, width and depth of the trench 317 may be precisely defined. In one embodiment, the profile of the trench 317 may be substantially parallel to the profile of the trench 208. In one embodiment, the trench 317 may be formed on a central position of the piezoelectric material 314.

Figure 5:
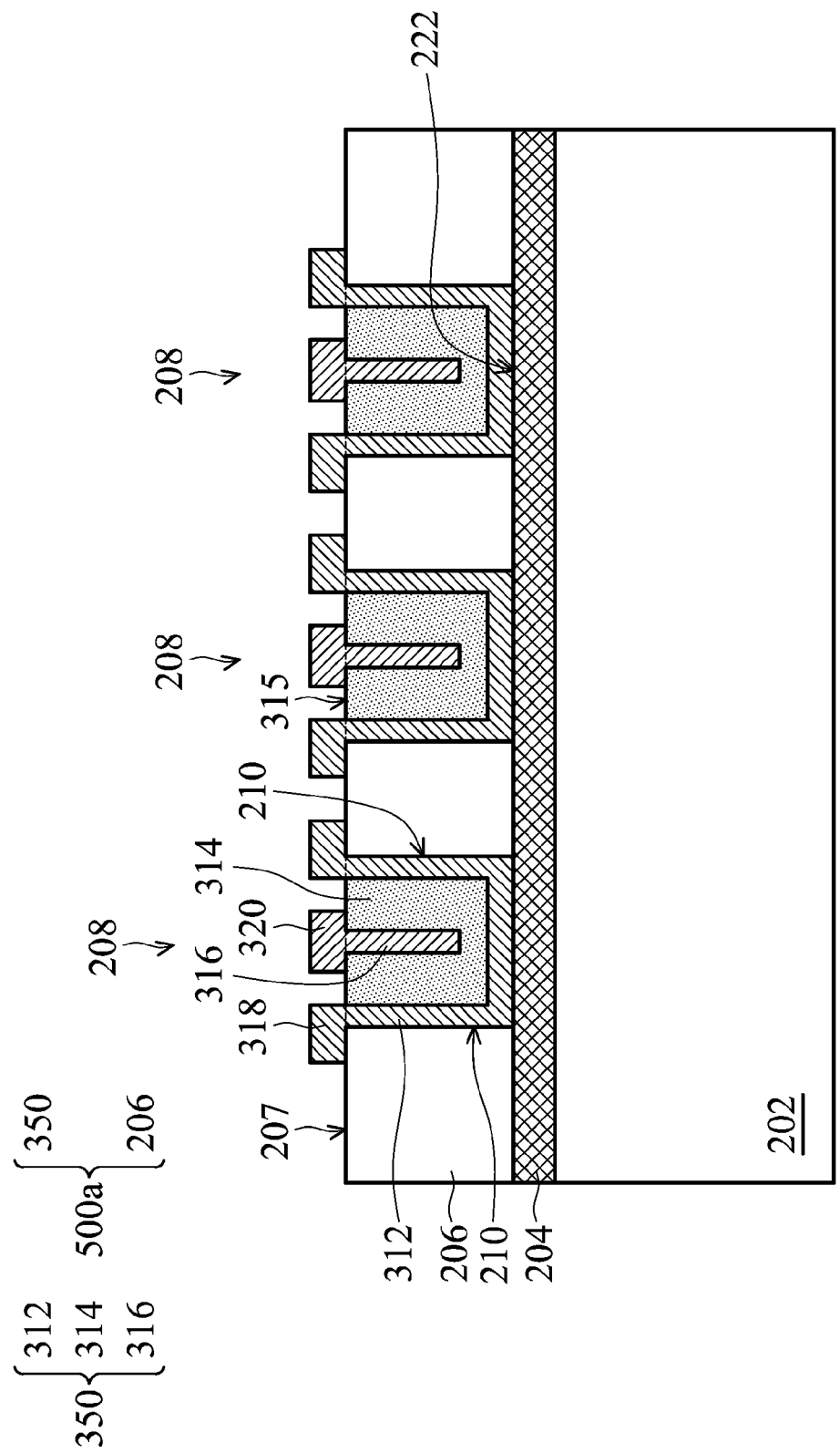

Next, as shown in FIG. 5, another deposition process and another patterning process may be performed to form a second electrode 316 in the trench 317 of the piezoelectric material 314, while forming an output electrode 320 on the second electrode 316. In one embodiment, the patterning process may comprise a lithography process and an etching process. As shown in FIG. 5, the top surface of the second electrode 316 may be coplanar with the top surface 207 of the substrate 200 (the sensor-device layer 206 of the substrate 200). Also, the input electrode 318 is disposed on the top surface 207 of the substrate 200 (the sensor-device layer 206 of the substrate 200), and the output electrode 320 is disposed on the top surface 315 of the piezoelectric material 314. As shown in FIG. 5, the first electrode 312 and the second electrode 316 disposed in the same trench 208 are separated from each other by the piezoelectric material 314. In one embodiment, the first electrode 312, the second electrode 316, and the piezoelectric material 314 between the first electrode 312 and the second electrode 316 in each of the trenches 208 are collectively constructed as an actuator 350. Also, the first electrode 312 and the second electrode 316 disposed in the same trench 208 may be substantially perpendicular to the top surface 207 of the substrate 200 (the sensor-device layer 206 of the substrate 200). Moreover, the piezoelectric material 314 may be disposed laterally between the first electrode 312 and the second electrode 316. Therefore, the direction of the electrode field generated between the first electrode 312 and the second electrode 316 disposed in the same trench 208 (please refer to the direction of the electrode field E as shown in FIG. 1) is parallel to the direction S of polarization of the piezoelectric material 314 (please refer to the direction S of polarization of the piezoelectric material as shown in FIG. 1). Therefore, the resonance mode of the resonator unit 500 is a side-field excitation (SFE) bulk acoustic resonance mode.

Next, as shown in FIG. 6, a patterning process and an etching process may be performed to remove a portion of the sensor-device layer 206 out of the trench 208, and a portion of the insulating layer 204 under the trench 208, thereby forming a trench 228 filled with air. In one embodiment, two terminal portions of the trench 228 filled with air are vertically formed through the sensor-device layer 206, extended into the insulating layer 204. Also, the trench 228 filled with air is horizontally extended along with a position of the insulating layer 204 close to the bottom of the trench 208. Further, the trench 228 filled with air is connected to the trench 208 at the bottom of the trench 208. Therefore, the MEMS-based resonator device 600a may be separated from the etched insulating layer 204 and the handle layer 202 by the trench 228 filled with air. After the aforementioned processes, one exemplary embodiment of a resonator unit 500a is completely formed. The resulting resonator unit 500a is floated over the handle layer 202. In one embodiment, the trench 228 filled with air surrounds at least one resonator unit 500a. In this embodiment, the trench 228 filled with air surrounds three resonator units 500a. However, the trench 228 filled with air may surround any number of resonator units 500a according to design. Also, a MEMS-based resonator device according to an exemplary embodiment 600a is formed completely after the aforementioned processes, and the MEMS-based resonator device 600a comprises a plurality of continuously arranged resonator units 500a.

Alternatively, the method as shown in FIGS. 2 to 6 may also fabricate a MEMS-based resonator device 600b according to another exemplary embodiment as shown in FIG. 1B. One of the differences between the method for fabricating the MEMS-based resonator devices 600a and 600b is that the method for fabricating the MEMS-based resonator device 600b forms a single resonator unit (similar to the resonator unit 500a as shown in FIG. 6) in the sensor-device layer of the substrate.

Alternatively, the trenches used to define the boundary positions of the actuators of the resulting MEMS-based resonator device may have various profiles. Alternatively, the sidewall 410 of a trench 408 may not be perpendicular to the top surface 207 of the sensor-device layer 206. FIG. 7 shows a cross section of a resonator unit 500b of a MEMS-based resonator device according to another exemplary embodiment. As shown in FIG. 7, an angle a between the sidewall 410 of a trench 408 and the top surface 207 of the sensor-device layer 206 may not have a value of 90 degrees. A first electrode 412 is formed conforming to the profile of the trench 408. Next, a piezoelectric material 414 fills the trench 408, covering the sidewalls of the first electrode 412. Also, the sidewalls of a second electrode 416 are substantially parallel to the sidewalls of the first electrode 412. Additionally, a pair of output electrodes 418 and an input electrode 420 of the resonator unit 500b are disposed on the top surface 207 of the sensor-device layer 206, and the input electrode 420 is disposed between the pair of output electrodes 418.

Figure 8A:
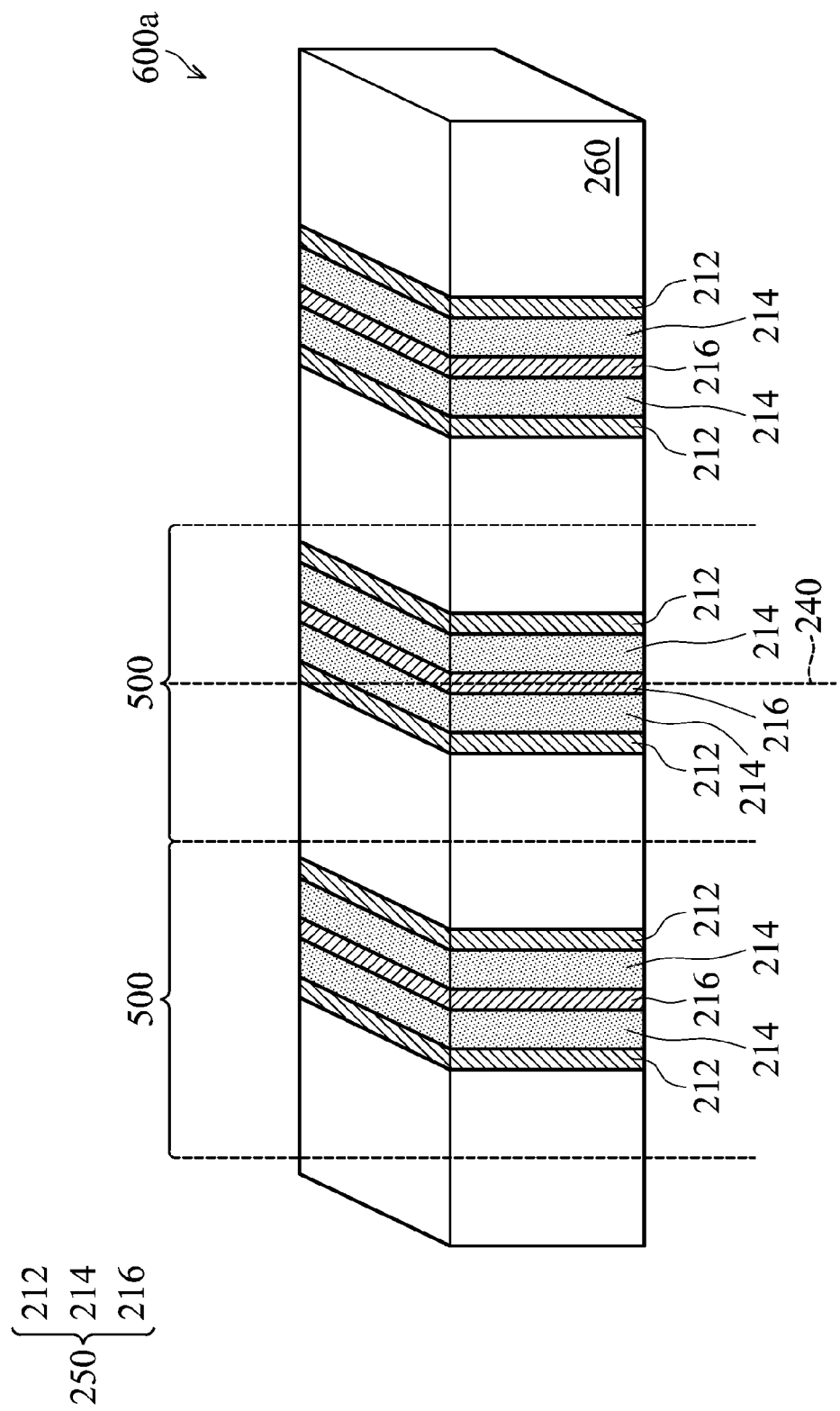

FIGS. 8A and 8B show three-dimensional views of a MEMS-based resonator device according to exemplary embodiments. As shown in FIG. 8a, the MEMS-based resonator device 600a may comprise a plurality of continuously arranged resonator units 500. Also, in another embodiment as shown in FIG. 8B, the MEMS-based resonator device 600b may comprise a single resonator unit 500. Also, FIGS. 8A and 8B illustrate a design of the position of the piezoelectric material 214 of the resonator unit. Because the resonance mode of one exemplary embodiment of a resonator unit is a side-field excitation (SFE) bulk acoustic resonance mode, the piezoelectric material 214 may be designed between the first electrodes 212 and the second electrode 216 in one embodiment. Also, the piezoelectric material 214 may be designed to be disposed substantially at a central position of the actuator 250 (e.g. a position close to a dotted line 240). The electromechanical coupling coefficient ($K_{eff}^2$) of the actuator can be improved and the impedance of the actuator can be reduced.

Exemplary embodiments provide a structure for a microelectromechanical system (MEMS)-based resonator device with the following advantages. One or a plurality of resonator units of the MEMS-based resonator device is (are) constructed by composite materials including a semiconductor (silicon) substrate, a piezoelectric material, and metal electrodes. Additionally, the spaces between the first electrode(s) and the second electrode, which are arranged perpendicular to the surface of the substrate, and the width of the resonator unit(s) of the MEMS-based resonator device can be defined by the thin-film deposition process, the lithography process, and the etching process (the thin-film deposition process, the lithography process, and the etching process are used to define a period of the resonator unit(s), so that an operation frequency of the resonator unit(s) can be precisely defined.) Accordingly, a multi-band filter with low impedance and high bandwidth can be designed and fabricated in a single chip through one exemplary embodiment of the method for fabricating the MEMS-based resonator device and conventional circuit-design technology (e.g. a ladder-type resonator/filter layout design). Also, the resonance mode of exemplary embodiments of the MEMS-based resonator device is a side-field excitation (SFE) bulk acoustic resonance mode, and the piezoelectric material can be designed to be disposed at a stress concentration position of the actuator. Therefore, exemplary embodiments of the MEMS-based resonator device having a side-field excitation (SFE) bulk acoustic resonance mode can help to improve the bandwidth of the filter while reducing the impedance of the filter.

Figure 9:
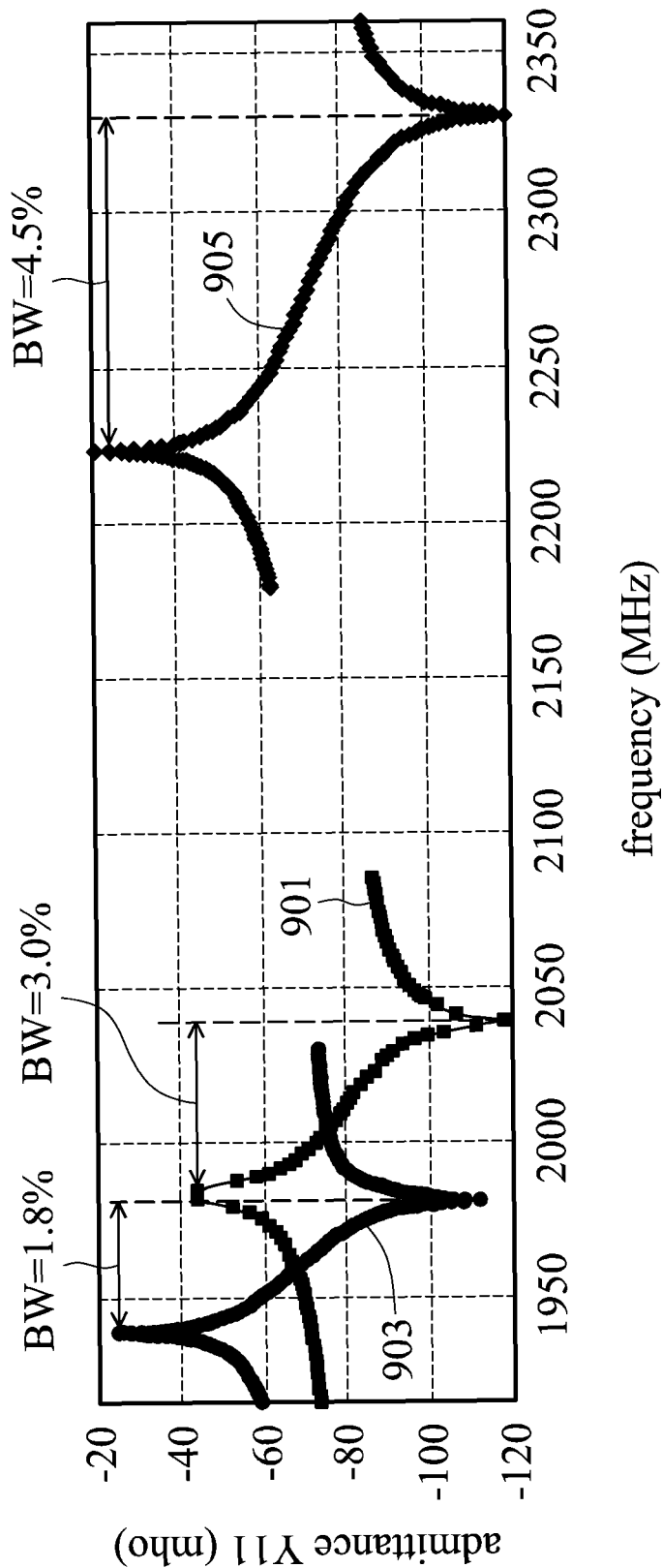
FIG. 9 shows simulation results of the frequency response of devices of the conventional FBAR MEMS-based resonator device, the conventional TFE MEMS-based resonator device, and a MEMS-based resonator device according to an exemplary embodiment, and the simulation result is analyzed by finite element software.

FIG. 9 shows simulation results of the frequency response of devices of the conventional FBAR MEMS-based resonator device, the conventional TFE MEMS-based resonator device, and a MEMS-based resonator device 600a/600b according to an exemplary embodiment, and the simulation result is analyzed by finite element software. Please refer to FIG. 9, curves 901, 903 and 905 show simulation results of frequency response of devices of the conventional FBAR MEMS-based resonator device, the conventional TFE MEMS-based resonator device, and the MEMS-based resonator device according to an exemplary embodiment 600a/600b, respectively. As shown in FIG. 9, because the MEMS-based resonator device according to an exemplary embodiment 600a/600b has a high electro-mechanical coupling coefficient ($K_{eff}^2$), the bandwidth (BW) performance (about 4.5%) between a resonate frequency point and an anti-resonate frequency point of the MEMS-based resonator device 600a/600b is larger than the bandwidth (BW) performance (about 3.0%) of the conventional FBAR MEMS-based resonator device and the bandwidth (BW) performance (about 1.8%) of the conventional TFE MEMS-based resonator device.

TABLE 1

Comparison table of the MEMS-based resonator device according to an exemplary embodiment and the conventional MEMS-based filter/resonator device

| filter/resonator structure | electro-mechanical coupling coefficient ($K_{eff}^2$) | band-width (BW) | determination of an operation frequency of the filter/resonator structure |
|---|---|---|---|
| conventional FBAR MEMS-based resonator device | 7.1% | 3.0% | thickness of the piezoelectric material |
| conventional TFE MEMS-based resonator device | 4.4% | 1.8% | width of the piezoelectric material |
| the MEMS-based resonator device 600a/600b according to an exemplary embodiment | 11.1% | 4.5% | width of the piezoelectric material |

From the results in Table 1, it is found that the MEMS-based resonator device according to an exemplary embodiment has the advantages of low impedance, high electro-mechanical coupling coefficient ($K_{eff}^2$), high bandwidth, and the resonator-unit-width defined-operation frequency.

It will be apparent to those skilled in the art that various modifications and variations can be made to the disclosed embodiments. It is intended that the specification and examples be considered as exemplary only, with the true scope of the disclosure being indicated by the following claims and their equivalents.

What is claimed is:

1. A structure for a microelectromechanical system (MEMS)-based resonator device, comprising:
at least one resonator unit, wherein the at least one resonator unit comprises:
a substrate having a trench therein;
a pair of first electrodes disposed on a pair of sidewalls of the trench;
a piezoelectric material filling the trench, covering the pair of first electrodes; and
a second electrode embedded in the piezoelectric material, separated from the pair of first electrodes by the piezoelectric material, wherein the second electrode disposed in the trench is parallel to the pair of first electrodes.

2. The structure for the MEMS-based resonator device as claimed in claim 1, wherein the pair of first electrodes extends to the bottom surface of the trench, and wherein the first electrodes are connected to each other.

3. The structure for the MEMS-based resonator device as claimed in claim 1, wherein the substrate comprises:
a handle layer;
a sensor-device layer disposed over the handle layer; and
an insulating layer disposed between the sensor-device layer and the handle layer.

4. The structure for the MEMS-based resonator device as claimed in claim 3, wherein the trench is disposed in the sensor-device layer, and the bottom surface of the trench is coplanar with the interface between the insulating layer and the sensor-device layer.

5. The structure for the MEMS-based resonator device as claimed in claim 4, wherein the substrate further comprises a trench filled with air through the sensor-device layer extending into the insulating layer, whereby the bottom surface of the pair of first electrodes, which is coplanar with the interface, is exposed to the trench filled with air.

6. The structure for the MEMS-based resonator device as claimed in claim 5, wherein the at least one resonator unit is floated over the handle layer.

7. The structure for the MEMS-based resonator device as claimed in claim 1, wherein the top surfaces of the pair of first electrodes, the top surface of the second electrode, and the top surface of the piezoelectric material are coplanar with the top surface of the substrate.

8. The structure for the MEMS-based resonator device as claimed in claim 1, wherein the at least one resonator unit further comprises:
a pair of output electrodes disposed on the top surface of the substrate, respectively connected to the pair of first electrodes; and
an input electrode disposed on the top surface of the piezoelectric material, connected to the second electrode.

9. The structure for the MEMS-based resonator device as claimed in claim 8, wherein the pair of output electrodes is substantially perpendicular to the pair of first electrodes, and the input electrode is substantially perpendicular to the second electrode.

10. The structure for the MEMS-based resonator device as claimed in claim 1, wherein the second electrode is embedded in a central position of the piezoelectric material.

11. The structure for the MEMS-based resonator device as claimed in claim 1, wherein the direction of the electrode field generated between the pair of first electrodes and the second electrode is parallel to the direction of polarization of the piezoelectric material.

12. The structure for the MEMS-based resonator device as claimed in claim 1, wherein the second electrode extends from the top surface of the piezoelectric material to the bottom surface of the trench.

13. The structure for the MEMS-based resonator device as claimed in claim 1, wherein the piezoelectric material of the at least one resonator unit is disposed in a central position thereof.

14. The structure for the MEMS-based resonator device as claimed in claim 1, wherein the at least one resonator unit is a plurality of the resonator units.

15. The structure for the MEMS-based resonator device as claimed in claim 14, wherein the plurality of resonator units is continuously arranged as a periodic structure, and wherein the period of the plurality of resonator units defines the operation frequency of the MEMS-based resonator device.

16. The structure for the MEMS-based resonator device as claimed in claim 14, wherein the substrates of the plurality of resonator units are Connected to each other.

* * * * *